United States Patent
Horimoto

(10) Patent No.: US 9,716,077 B2
(45) Date of Patent: Jul. 25, 2017

(54) WIRE CONNECTING METHOD AND TERMINAL

(71) Applicant: TOYOTA JIDOSHA KABUSHIKI KAISHA, Toyota-shi, Aichi-ken (JP)

(72) Inventor: Shuhei Horimoto, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/227,601

(22) Filed: Aug. 3, 2016

(65) Prior Publication Data
US 2017/0077063 A1 Mar. 16, 2017

(30) Foreign Application Priority Data

Sep. 11, 2015 (JP) ................................. 2015-179352

(51) Int. Cl.
*H01L 21/00* (2006.01)
*H01L 23/00* (2006.01)

(52) U.S. Cl.
CPC .............. *H01L 24/85* (2013.01); *H01L 24/48* (2013.01); *H01L 2224/48247* (2013.01); *H01L 2224/85125* (2013.01); *H01L 2224/85203* (2013.01); *H01L 2924/10272* (2013.01); *H01L 2924/13055* (2013.01); *H01L 2924/13091* (2013.01)

(58) Field of Classification Search
None
See application file for complete search history.

(56) References Cited

U.S. PATENT DOCUMENTS

| 7,497,695 | B2* | 3/2009 | Uchida | H01R 12/79 439/492 |
| 2006/0246767 | A1* | 11/2006 | Suzuki | H01R 4/2425 439/395 |
| 2010/0193948 | A1* | 8/2010 | Ohta | H01L 23/49811 257/738 |
| 2012/0009780 | A1* | 1/2012 | Lehr | H01L 24/05 438/652 |
| 2013/0075911 | A1* | 3/2013 | Wada | H01L 24/03 257/751 |

(Continued)

FOREIGN PATENT DOCUMENTS

| JP | H06-334067 A | 12/1994 |
| JP | 2007-095875 A | 4/2007 |

*Primary Examiner* — Alexander Ghyka
(74) *Attorney, Agent, or Firm* — Oliff PLC

(57) ABSTRACT

A method of connecting a wire with a terminal including a plurality of conductors is provided. The method includes: positioning the terminal by holding a part of the terminal between an upper side jig and a lower side jig; and connecting the wire and one of a plurality of conductors, which is exposed on a surface of the positioned terminal. The terminal includes a laminate structure that includes an insulator interposed between a first conductor and a second conductor. The part of the terminal held in the positioning of the terminal includes a pressure receiving area, where a contact area between the upper side jig and an upper surface of the terminal and a contact area between the lower side jig and a lower surface of the terminal overlap. The laminate structure exists outside of the pressure receiving area, and does not exist in the pressure receiving area.

1 Claim, 13 Drawing Sheets

(56) References Cited

U.S. PATENT DOCUMENTS

2014/0233204 A1\* 8/2014 Tokuyama ............ H02M 7/003
361/820
2015/0221604 A1\* 8/2015 Nagasawa ........... H01L 23/3677
257/782
2016/0372392 A1\* 12/2016 Sakamoto ............. H01L 23/055

\* cited by examiner

WIRE CONNECTING METHOD AND TERMINAL

CROSS-REFERENCE TO RELATED APPLICATION(S)

This application claims priority to Japanese Patent Application No. 2015-179352 filed on Sep. 11, 2015, the contents of which are hereby incorporated by reference into the present application.

TECHNICAL FIELD

The present application relates to a method connecting a terminal and a wire, and the terminal.

BACKGROUND ART

In a semiconductor device disclosed in Japanese Patent Application Publication No. 2007-95875, a semiconductor element and a terminal are connected by a wire, One end of the wire is connected to the semiconductor element, and the other end of the wire is connected to the terminal.

Generally, the terminal is configured of a single conductor. In this case, a number of necessary terminals tends to increase. To avoid this, a terminal that insulates plural conductors by layering a conductor, an insulator, and a conductor in this order is being developed. With this terminal, one terminal is provided with two or more conductors, and the number of necessary terminals can be decreased. However, wires need to be connected respectively to the two or more conductors.

There is a case where one end of a terminal is fixed and rest of it is protruding in an elongate form. At its protruding portion, an upper surface and a lower surface of the terminal are freed, and are not constrained. In a case of connecting wires to this type of terminal, the terminal needs to be positioned while constraining the upper and lower surfaces in a vicinity of a connecting portion. The terminal needs to be held between a pair of jig, and the wires need to be connected in this state.

SUMMARY

In a connecting method that fixes a terminal by holding the terminal between a pair of jigs, an insulator between conductors in the terminal may be damaged by a holding pressure thereof, and an insulation between the conductors that are insulated by the insulator may fail.

The present description proposes a wire connecting method and a terminal structure that can prevent failure of an insulation between conductors in a terminal that may be caused by a holding pressure of a pair of jigs.

In a wire connecting method disclosed herein, a terminal and a wire are connected. This connecting method comprises positioning the terminal by holding a part of the terminal between an upper side jig and a lower side jig; and connecting the wire and one of a plurality of conductors, which is exposed on a surface of the positioned terminal (on an upper surface, a lower surface, or both of upper and lower surfaces thereof). In the present description, an area of the terminal where a contact area between the upper side jig and the upper surface of the terminal and a contact area between the lower side jig and the lower surface of the terminal overlap is termed a pressure receiving area. In the terminal, a relationship is established such that a laminate structure that comprises an insulator interposed between a first conductor and a second conductor exists outside of the pressure receiving area, and does not exist in the pressure receiving area.

According to such a configuration, since the laminate structure that comprises the insulator interposed between the first conductor and the second conductor does not exist in the pressure receiving area of the terminal, an incident where an insulation thereof fails due to the insulator being damaged does not occur. The terminal is not held between the pair of jigs outside the pressure receiving area of the terminal. The incident where the insulation between the first and second conductors fails due to the insulator being damaged does not occur.

The insulator exists between the first and second conductors at outside of the pressure receiving area, and thus the first and second conductors are thereby insulated. The laminate structure of the first conductor, the insulator, and the second conductor is not required over an entire region of the terminal to maintain the insulation between the first and second conductors. For example, in a case of configuring each of both end portions of the terminal in a width direction as a pressure receiving area and a center portion thereof in the width direction as a no-pressure area, a terminal that is elongated along its long direction can be obtained if the laminate structure of the first conductor, the insulator, and the second conductor is present in the center portion. In the pressure receiving areas located at both end portions in the width direction, the terminal that is elongated along its long direction can be obtained even if for example one of the first and second conductors does not exist therein. If one of the first and second conductors does not exist, it means that the laminate layer in which the insulator is interposed between the first and second conductors does not exist in the pressure receiving areas. Even if the insulator is damaged in one of the pressure receiving areas, the insulation thereof will not fail, because the structure in which the first and second conductors are insulated by the insulator interposed therebetween is not utilized in the pressure receiving areas.

A terminal disclosed herein comprises an upper surface ad a lower surface. The terminal comprises a laminate structure that arranges an insulator between a first conductor and a second conductor. In a plan view of one of the upper and lower surfaces, an existing area where the laminate structure exists and a non-existing area where the laminate structure does not exist, are present together.

In this terminal, by holding its non-existing area where the laminate structure does not exist in between the pair of jigs, the insulation can be protected upon working on its connection.

DETAILED DESCRIPTION

Figure 1:
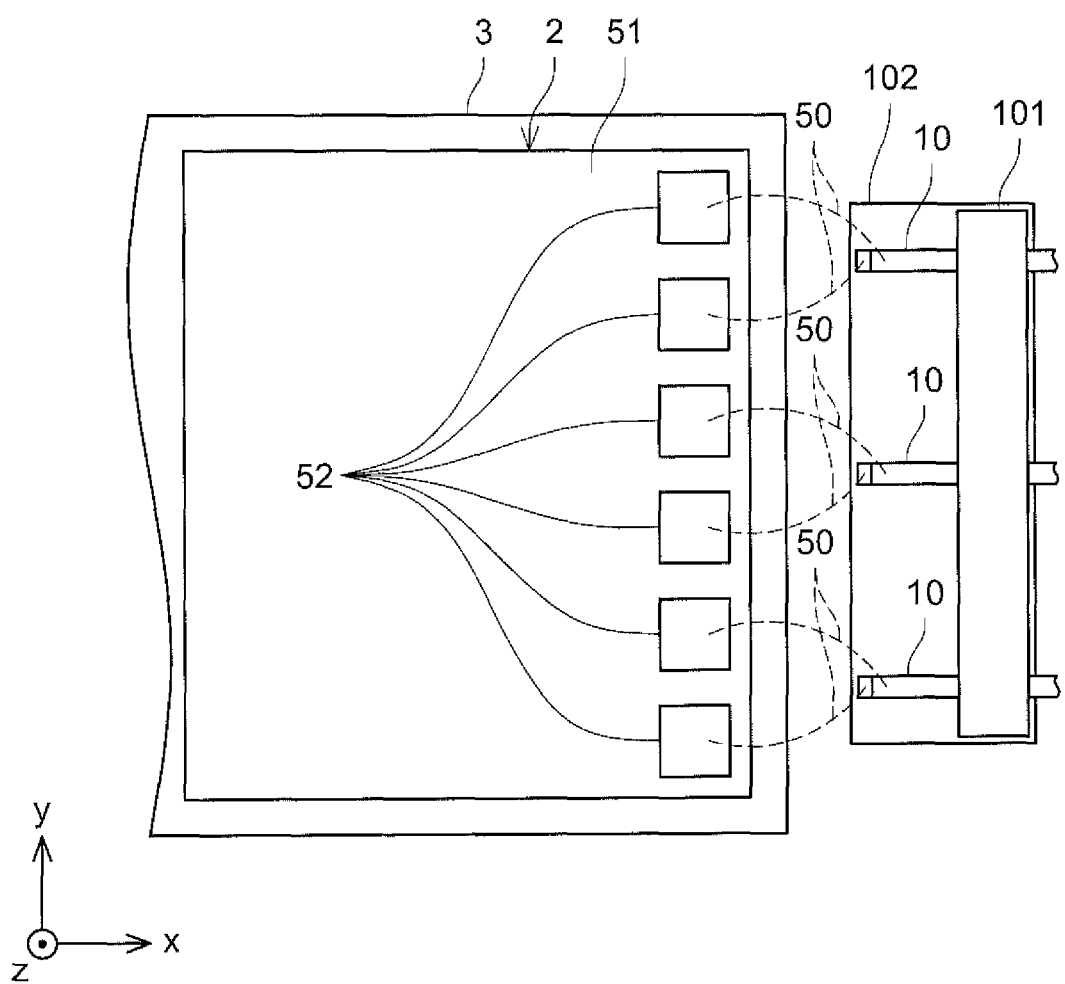
FIG. 1 is a plan view for explaining a wire connecting method of an embodiment.
Figure 2:
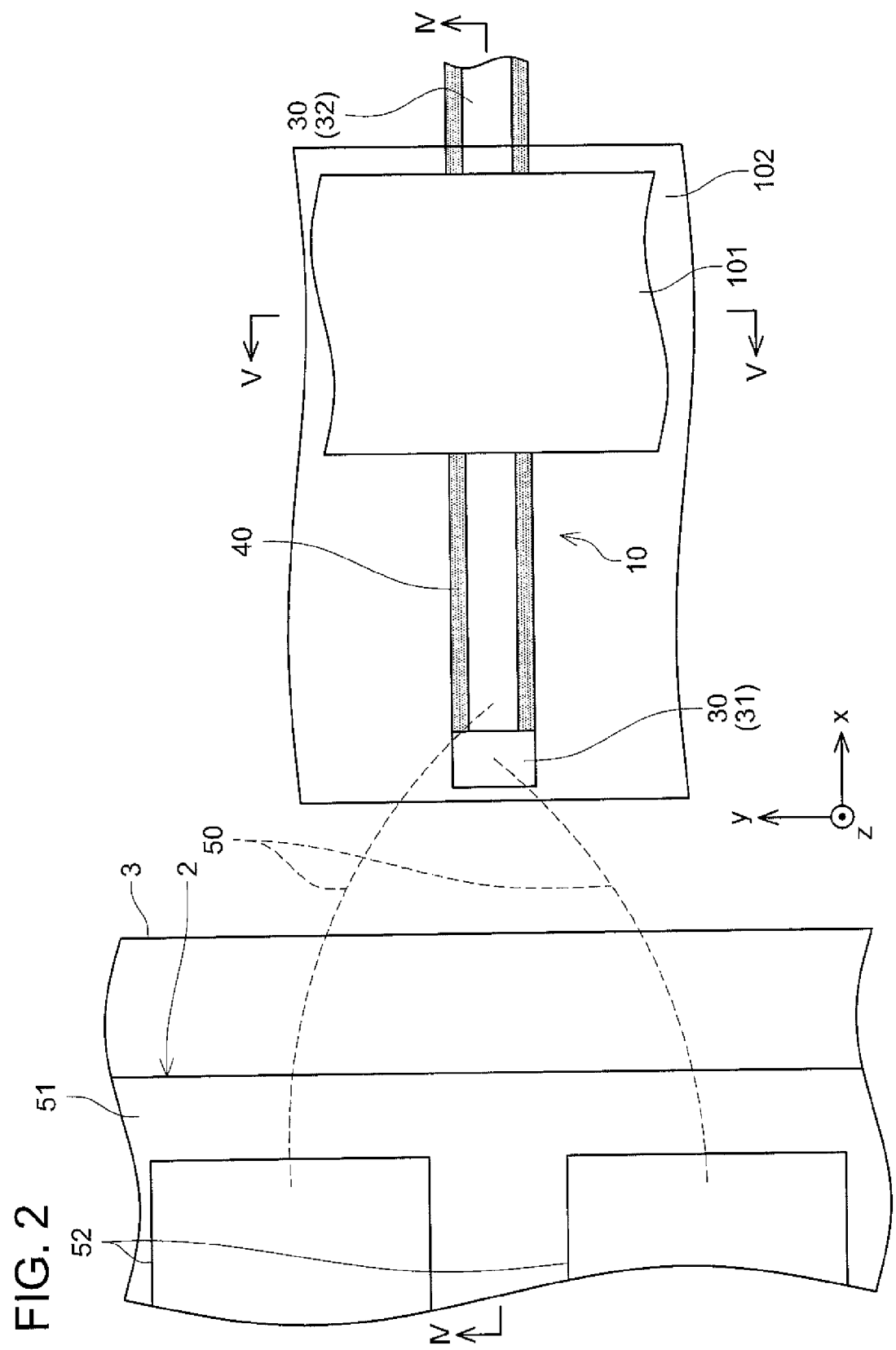
FIG. 2 is a plan view showing a part of FIG. 1 in an enlarged view.
Figure 3:
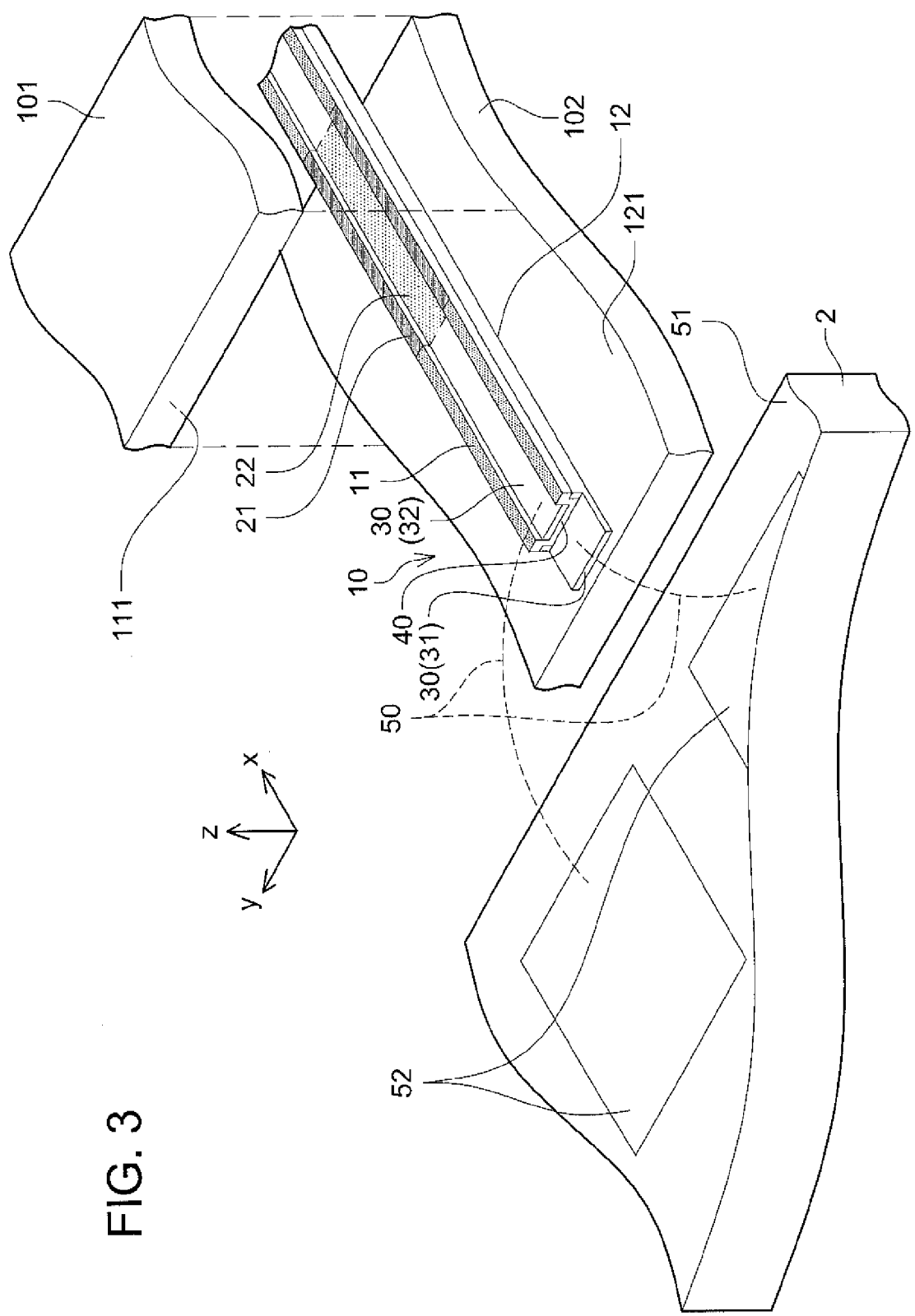
FIG. 3 is a perspective diagram that shows a part of FIG. 1 in an enlarged view.

A wire connecting method and a terminal will be described. In a wire connecting method of an embodiment, as shown in FIGS. 1 to 3, firstly, a plurality of terminals 10 is held between an upper side jig 101 and a lower side jig 102. The upper side jig 101 and the lower side jig 102 face each other via the terminals 10. The terminals 10 are positioned in a posture of being held between the upper side jig 101 and the lower side jig 102. The plurality of terminals 10 is positioned relative to a semiconductor element 2 (positioning process).

The semiconductor element 2 is arranged on a lead frame 3. The semiconductor element 2 is for example an IGBT (Insulated Gate Bipolar transistor), a MOSFET (Metal Oxide Semiconductor Field Effect Transistor), and the like. In the present embodiment, a MOSFET is used as the semiconductor element 2. The semiconductor element 2 comprises a semiconductor substrate 51 configured for example of SiC, and a collector region, emitter regions, and the like (all of which are omitted from the drawings) are provided on the semiconductor substrate 51. Further, a plurality of signal electrodes 52 is provided on an upper surface of the semiconductor substrate 51. The signal electrodes 52 are provided for example for sending and receiving electric signals for detecting a temperature of the semiconductor element 2, electric signals for controlling on/off of the semiconductor element 2.

Figure 4:
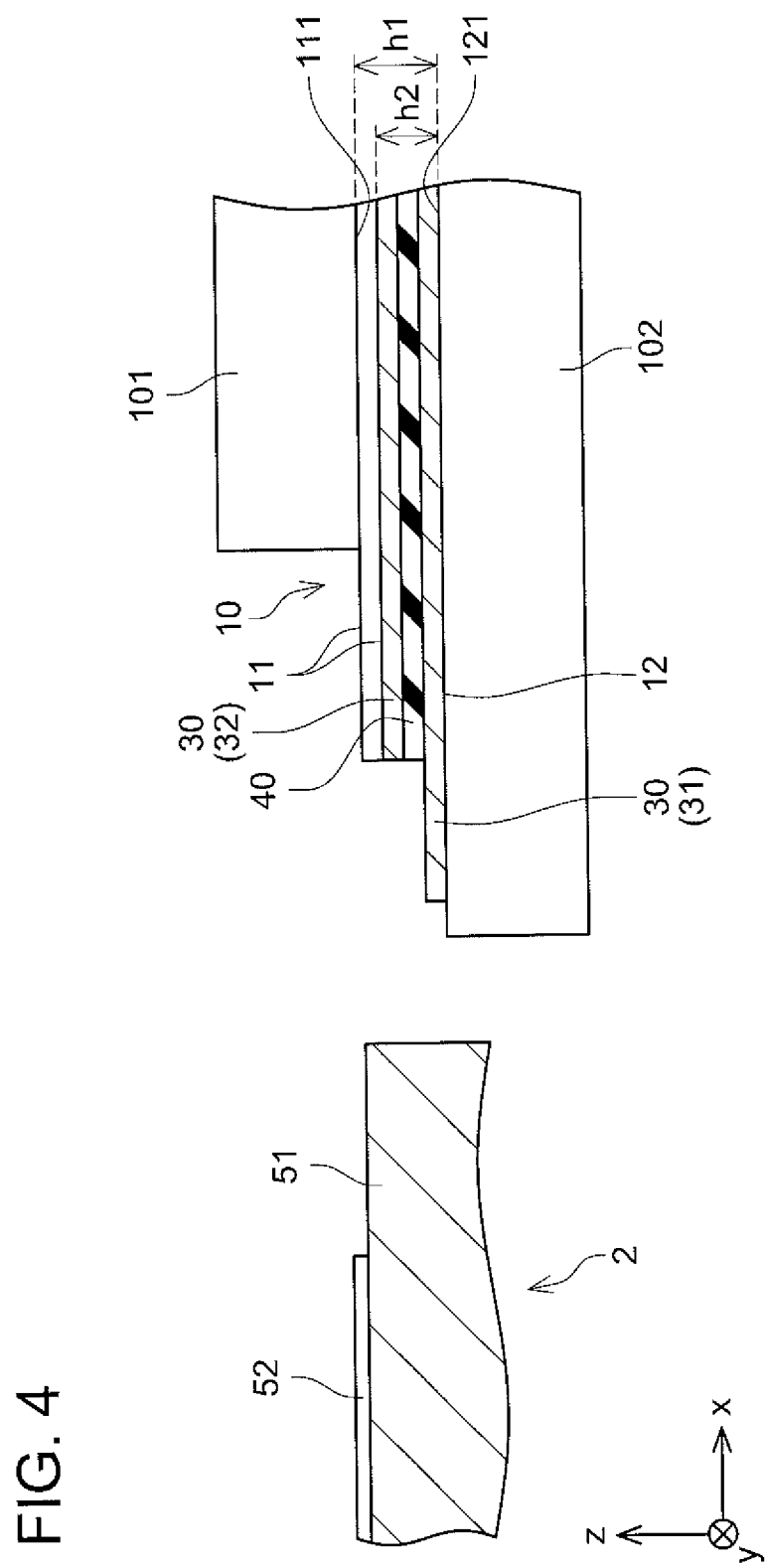
FIG. 4 is a IV-IV cross sectional view of FIG. 2 in a positioning process.
Figure 5:
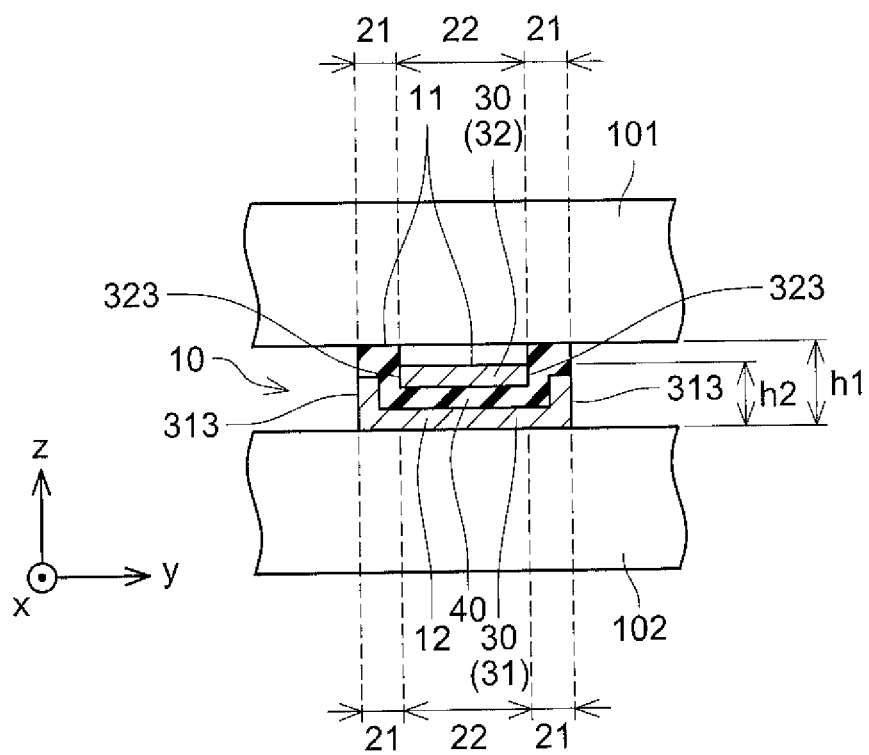
FIG. 5 is a V-V cross sectional view of FIG. 2.

As shown in FIGS. 4 and 5, each terminal 10 comprises an upper surface 11 and a lower surface 12. Parts of the upper surface 11 of the terminal 10 make contact with the upper side jig 101. The parts of the upper surface 11 of the terminal 10 are pressed by the upper side jig 101. Further, the lower surface 12 of the terminal 10 makes contact with the lower side jig 102. The lower surface 12 of the terminal 10 is pressed by the lower side jig 102. In this disclosure, an area where a contact area between the upper side jig 101 and the upper surface 11 of the terminal 10 and a contact area between the lower side jig 102 and the lower surface 12 of the terminal 10 overlap is termed a pressure receiving area (first area) 21. Further, an area other than the pressure receiving area 21 will be termed a no-pressure area (second area) 22. That is, an area where the contact area between the upper side jig 101 and the upper surface 11 of the terminal 10 and the contact area between the lower side jig 102 and the lower surface 12 of the terminal 10 do not overlap will be termed the no-pressure area (second area) 22. A distance h1 between the upper surface 11 and the lower surface 12 of the terminal 10 in each of the pressure receiving areas (first areas) 21 is longer than a distance h2 between the upper surface 11 and the lower surface 12 of the terminal 10 in the no-pressure area (second area) 22.

Each of the terminals 10 comprises two conductors 30 (a first conductor 31 and a second conductor 32) and one insulator 40. The conductors 30 (the first conductor 31 and the second conductor 32) are made of metal such as copper or aluminum, for example. The first conductor 31 is made by pressing a metal plate, for example. The second conductor 32 is made by sputtering metal on the insulator 40, for example. Alternatively, the second conductor 32 may be made by electroless plating. The insulator 40 is made for example of silicon dioxide ($SiO_2$). The insulator 40 is made by sputtering $SiO_2$ on the first conductor 31, for example.

A laminate structure is configured by the two conductors 30 (the first conductor 31 and the second conductor 32) and the one insulator 40 being laminated. The insulator 40 is interposed between the first conductor 31 and the second conductor 32. The first conductor 31 is arranged on one surface side of the insulator 40, and the second conductor 32 is arranged on the other surface side of the insulator 40. The first conductor 31 and the second conductor 32 are insulated by the insulator 40.

Each of the terminal 10 comprises an existing area and non-existing areas. The existing area of the terminal 10 corresponds to the aforementioned no-pressure area (second area) 22. In the existing area (no-pressure area 22) of the terminal 10, the laminate structure having the insulator 40 interposed between the first conductor 31 and the second conductor 32 exists therein when the upper surface 11 or the lower surface 12 of the terminal 10 is seen in a plan view. That is, the laminate structure in which the first conductor 31, the insulator 40, and the second conductor 32 are laminated in this order is present in the existing area (no-pressure area 22) of the terminal 10. In the existing area (no-pressure area 22), the first conductor 31, the second conductor 32, and the insulator 40 are present.

The non-existing areas of the terminal 10 correspond to the aforementioned pressure receiving areas (first areas) 21. In each of the non-existing areas (pressure receiving areas 21) of the terminal 10, the laminate structure having the insulator 40 interposed between the first conductor 31 and the second conductor 32 does not exist therein when the upper surface 11 or the lower surface 12 of the terminal 10 is seen in the plan view. That is, in the non-existing areas (pressure receiving areas 21) of each terminal 10, the laminate structure in which the first conductor 31, the insulator 40, and the second conductor 32 are laminated in this order is not present (absent). In each of the non-existing areas (pressure receiving areas 21), only the first conductor 31 and the insulator 40 are present.

Each first conductor 31 is opposed to the lower side jig 102. The lower side jig 102 makes contact with lower surfaces of the first conductors 31. Each second conductor 32 is opposed to the upper side jig 101. The upper side jig 101 does not make contact with any of the second conductors 32. The upper side jig 101 makes contact with upper surfaces of each of the insulators 40.

As shown in FIG. 4, one end of each first conductor 31 in a long direction of the terminal 10 (x direction) protrudes out in the long direction than one end of its corresponding second conductor 32 and one end of its corresponding insulator 40. As shown in FIG. 5, both side surfaces 313, 313 of each first conductor 31 in a short direction of the terminal 10 (y direction) are exposed to outside. Both side surfaces 323, 323 of the corresponding second conductor 32 make contact with the insulator 40.

The upper side jig 101 and the lower side jig 102 are plate-shaped members. The upper side jig 101 comprises a pressing surface 111. The pressing surface 111 of the upper side jig 101 is opposed to the upper surfaces 11 of the terminals 10. The lower side jig 102 comprises a pressing surface 121. The pressing surface 121 of the lower side jig 102 is opposed to the lower surfaces 12 of the terminals 10. The lower side jig 102 supports the lower surfaces 12 of the terminals 10. The lower side jig 102 supports the terminals 10 over tip portions to central portions of the terminals 10 in the long direction.

Figure 6:
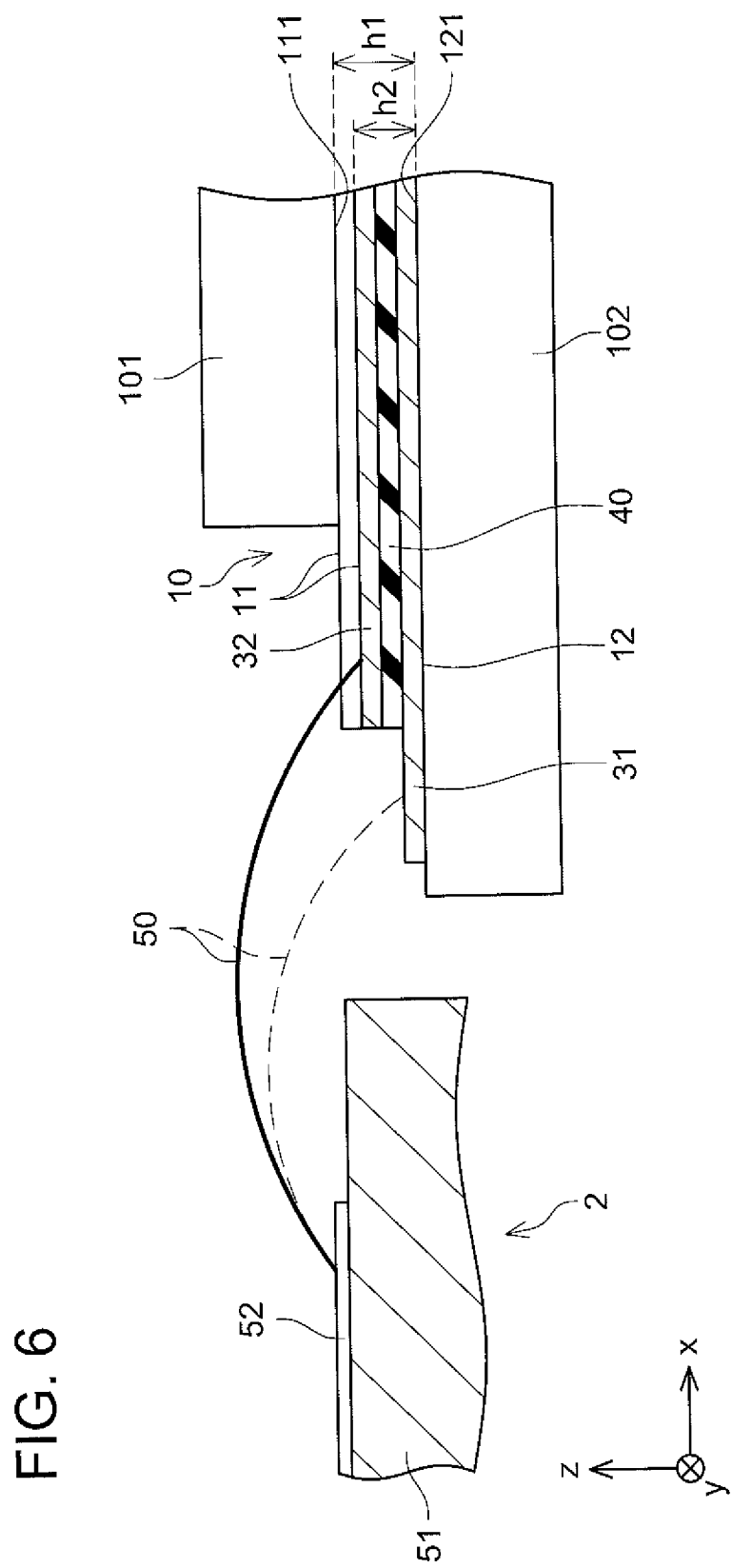
FIG. 6 is a IV-IV cross sectional view of FIG. 2 in a connecting process.

In a wire connecting method, the terminals 10 are positioned by the upper side jig 101 and the lower side jig 102, and thereafter wires 50 are connected to the positioned terminals 10 as shown in FIG. 6 (connecting process), Wires 50 are connected to the conductors 30 exposed on the surface of each terminal 10. One ends of the wires 50 are connected respectively to the first conductor 31 and the second conductor 32 exposed from each terminal 10. The wires 50 are connected respectively to the upper surface of the first conductor 31 and the upper surface of the second conductor 32. Two wires 50 are connected to one terminal 10. Further, the other ends of the wires 50 are connected to the semiconductor element 2. The wires 50 are connected respectively to the plurality of signal electrodes 52 of the semiconductor element 2. A plurality of wires 50 is connected to one semiconductor element 2. One ends of the wires 50 are connected to the terminals 10, and the other ends of the wires 50 are connected to the semiconductor element 2. The connection of the wires 50 can be performed by using a well-known wire bonding device.

According to the wire connecting method and the terminals having the aforementioned configurations, the pressure receiving areas (non-existing areas) 21 of each of the terminals 10 are pressed by both jigs 101, 102 upon positioning the terminal 10 by the upper side jig 101 and the lower side jig 102. Each of the terminals 10 is pressed along a laminated direction of the conductors 30 (the first conductor 31 and the second conductor 32) and the insulator 40. At this occasion, in each of the pressure receiving areas (non-existing areas) 21 of the terminal 10, the pressing does not take place thereon in a state where the insulator 40 is held between two conductors (the first conductor 31 and the second conductor 32) since the laminate structure in which the insulator 40 is interposed between the first conductor 31 and the second conductor 32 does not exist therein. Further, in the no-pressure area (existing area) 22 of each of the terminals 10, the terminal 10 is not pressed by the upper side jig 101 and the lower side jig 102. Thus, in the no-pressure area (existing area) 22 as well, the pressing does not take place thereon in the state where the insulator 40 is held between two conductors (the first conductor 31 and the second conductor 32), Due to this, the insulator 40 can be suppressed from being damaged due to the insulator 40 not receiving any pressing force between the two conductors (the first conductor 31 and the second conductor 32).

As above, an embodiment has been described, however, the specific configuration of the teachings herein is not limited to the above embodiment. In the description below, configurations similar to the configurations in the above disclosure will be given the same reference signs, and the description thereof may be omitted.

(Other Embodiments of Terminal)

Figure 7:
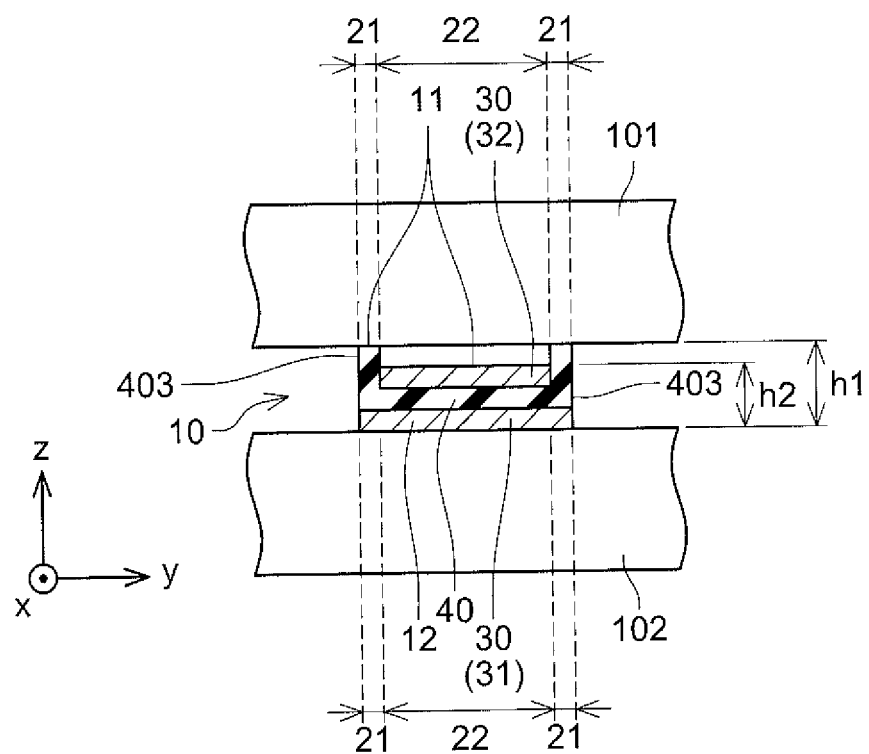
FIG. 7 is a cross sectional view of a terminal of another embodiment.

The configuration of the terminal is not limited to the above embodiment. For example, in the terminal 10 shown in FIG. 7, the first conductor 31 has a plate shape. Entireties of both side surfaces 403, 403 in the y direction of the insulator 40 are exposed to the outside. The both side surfaces 403, 403 of the insulator 40 are not covered by the first conductor 31.

Figure 8:
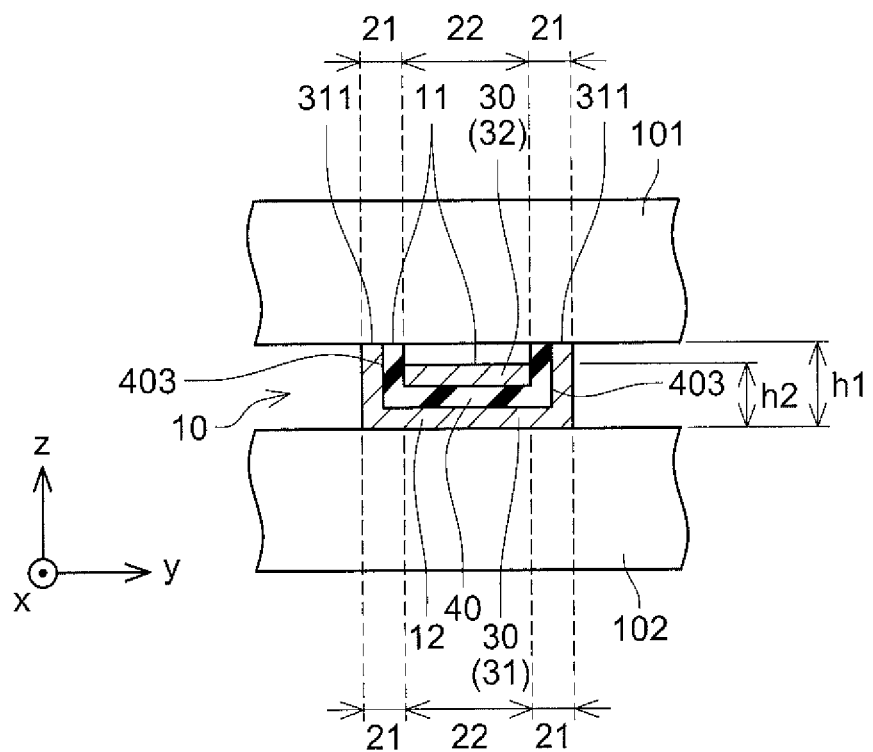
FIG. 8 is a cross sectional view of a terminal of yet another embodiment.

In the terminal 10 shown in FIG. 8, entireties of both side surfaces 403, 403 in the y direction of the insulator 40 make contact with the first conductor 31. The first conductor 31 covers the entireties of the both side surfaces 403, 403 of the insulator 40. Upper surfaces 311 of the first conductor 31 at both end portions are exposed to outside of the terminal 10. The upper surfaces 311 of the first conductor 31 at both end portions make contact with the upper side jig 101.

Figure 9:
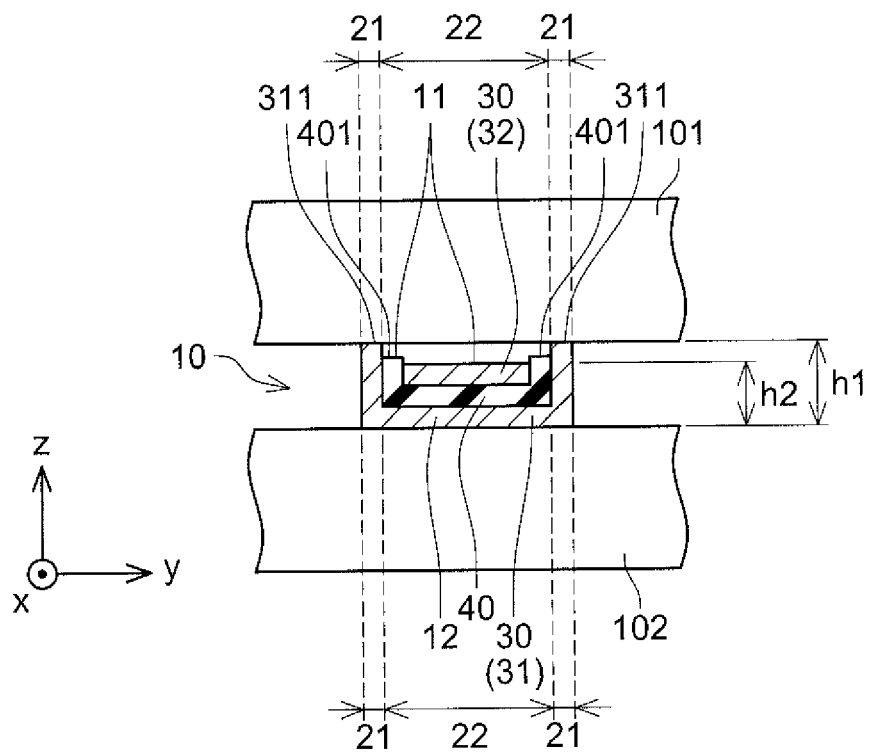
FIG. 9 is a cross sectional view of a terminal of yet another embodiment.

In the terminal 10 shown in FIG. 9, height positions of the upper surfaces 311 of the first conductor 31 at both end portions and height positions of upper surfaces 401 of the insulator 40 at both end portions do not match. The upper surfaces 311 of the first conductor 31 at both end portions are at higher positions than the upper surfaces 401 of the insulator 40 at both end portions. Only the first conductor 31 exists in the pressure receiving areas (non-existing areas) 21 of the terminal 10.

Figure 10:
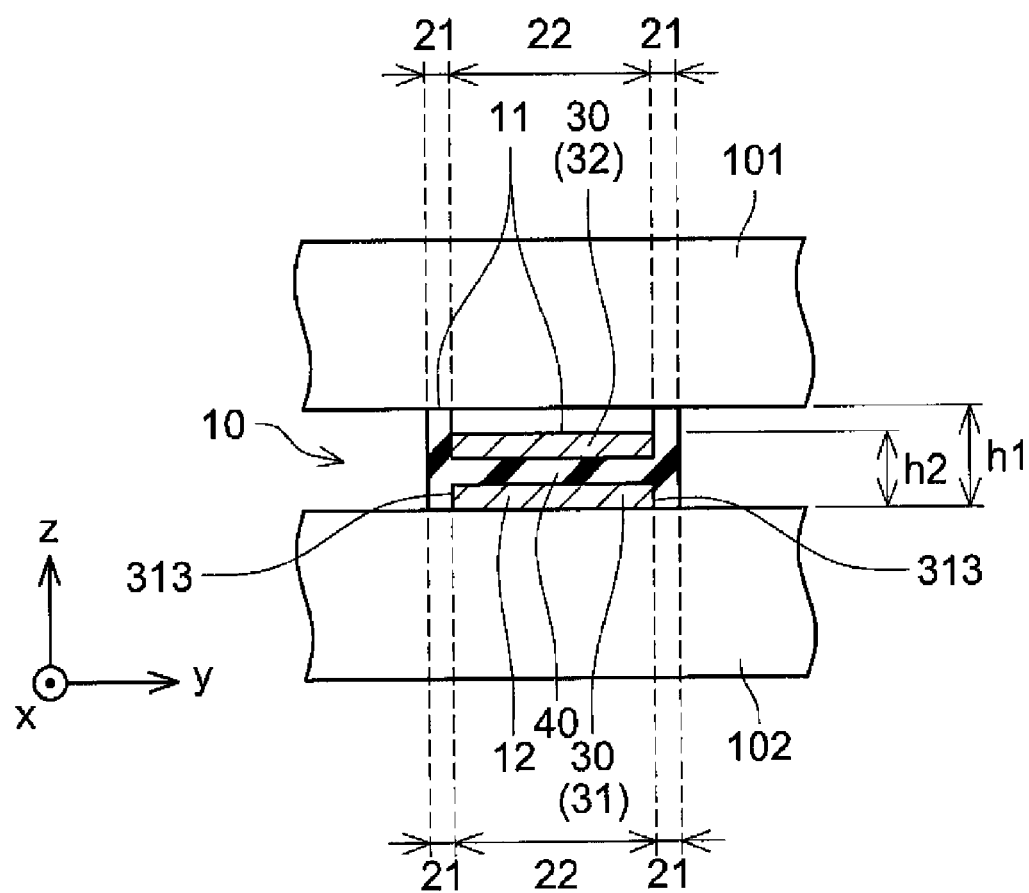
FIG. 10 is a cross sectional view of a terminal of yet another embodiment.

In the terminal 10 shown in FIG. 10, both side surfaces 313, 313 of the first conductor 31 in the y direction make contact with the insulator 40. The insulator 40 covers the entireties of the both side surfaces 313, 313 of the first conductor 31. The both side surfaces 313, 313 of the first conductor 31 are not exposed to the outside of the terminal 10. Only the insulator 40 exists in the pressure receiving areas (non-existing areas) 21 of the terminal 10.

Figure 11:
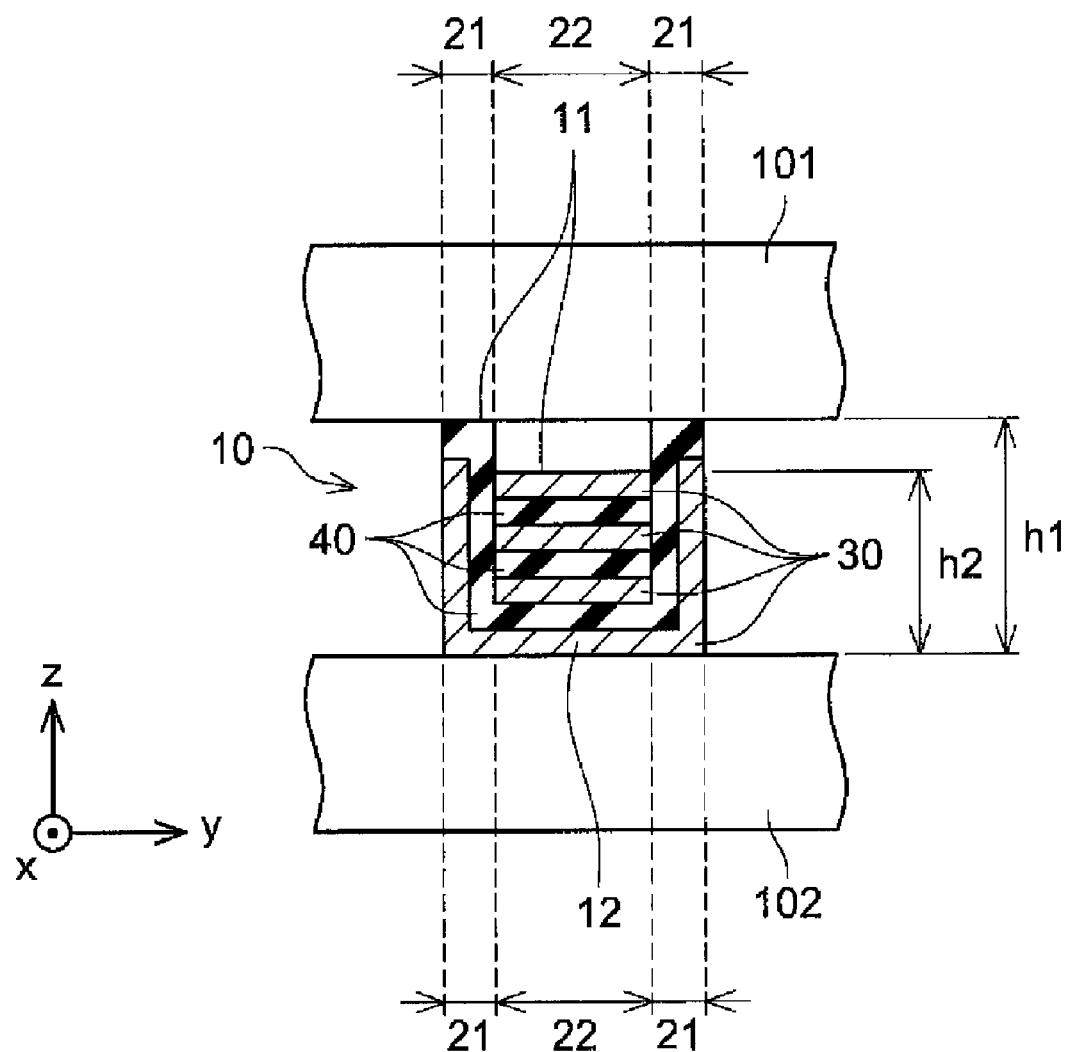
FIG. 11 is a cross sectional view of a terminal of yet another embodiment.

Further, in the above embodiments, the terminal 10 has two layers of conductors 30 (the first conductor 31 and the second conductor 32) and one layer of insulator 40, however, no limitation is made to this configuration. As shown in FIG. 11, the terminal 10 may comprise plural layers (four layers in the terminal 10 shown in FIG. 11) of conductors 30 and plural layers (three layers in the terminal 10 shown in FIG. 11) of insulators 40. Numbers of the conductors 30 and the insulators 40 are not particularly limited. Further, each of the aforementioned terminals 10 may be inverted in the z direction.

Figure 12:
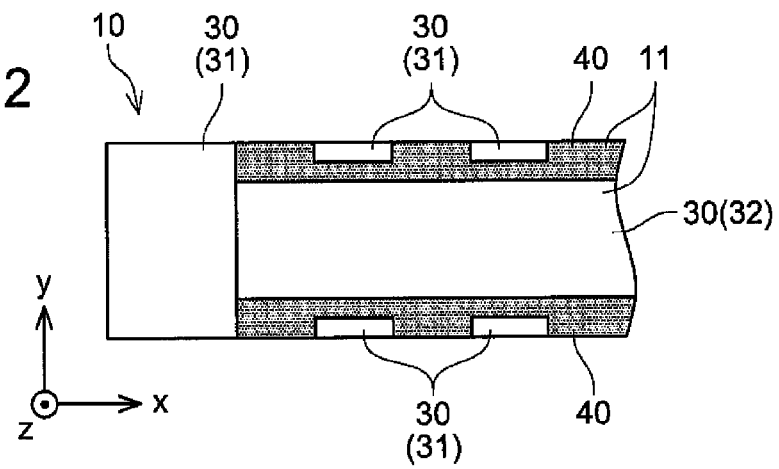
FIG. 12 is a plan view of a part of a terminal of yet another embodiment in an enlarged view.

Further, the configuration of the terminal in its plan view is not limited to those in the above embodiments. For example, in the terminal 10 shown in FIG. 12, the first conductor 31 comprises portions exposed on the upper surface 11 of the terminal 10. The first conductor 31 is exposed on the upper surface 11 of the terminal 10 at plural portions of the terminal 10.

Figure 13:
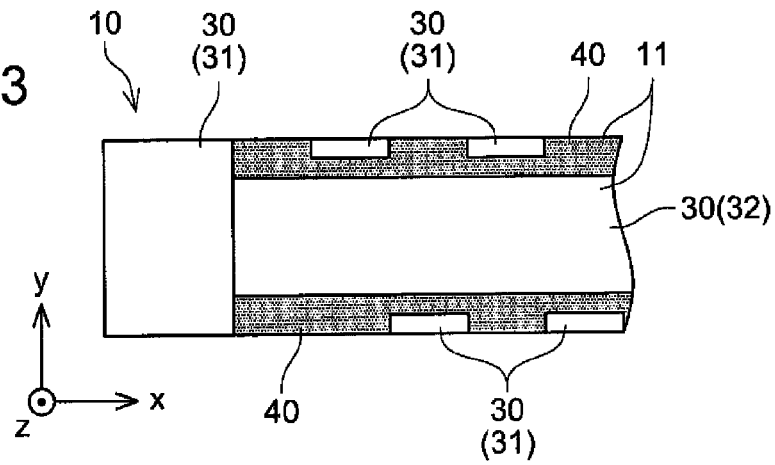
FIG. 13 is a plan view of a part of a terminal of yet another embodiment in an enlarged view.

In the terminal 10 shown in FIG. 13, the first conductor 31 exposed on the upper surface 11 of the terminal 10 at one end in the y direction and the first conductor 31 exposed on the upper surface 11 of the terminal 10 at the other end in the y direction are in a state of being offset one another in the x direction.

Figure 14:
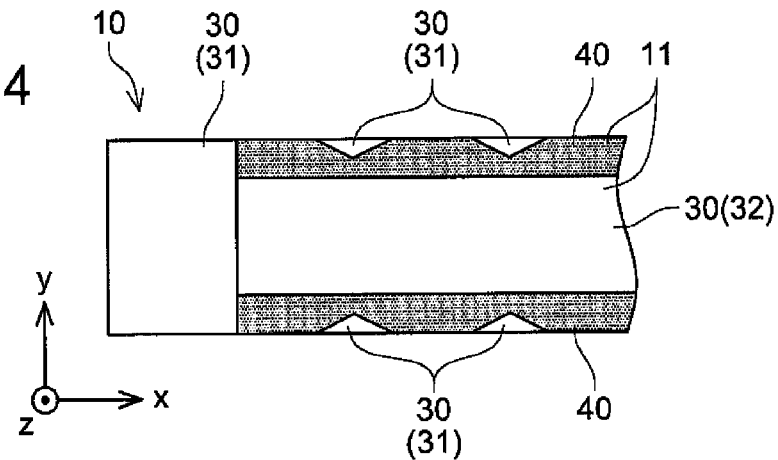
FIG. 14 is a plan view of a part of a terminal of yet another embodiment in an enlarged view.

In the terminal 10 shown in FIG. 14, a shape of the portions where the first conductor 31 is exposed on the upper surface 11 of the terminal 10 is triangle.

Figure 15:
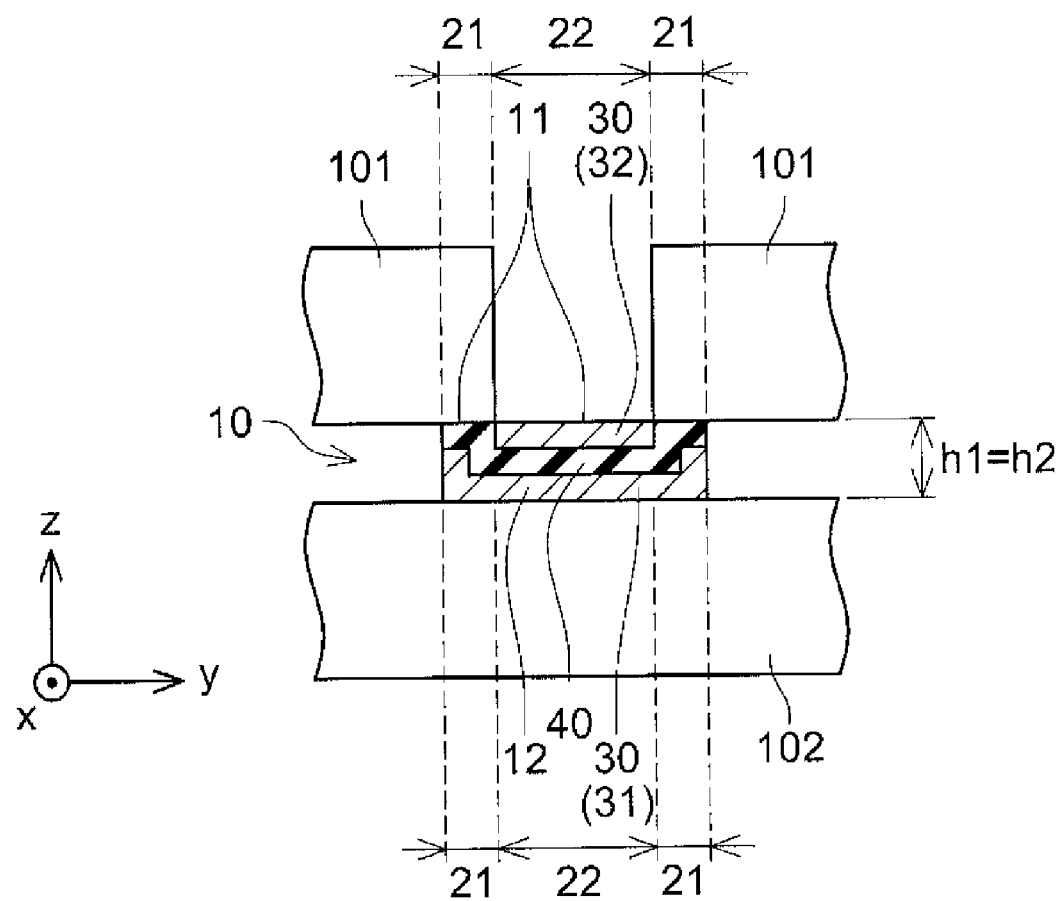
FIG. 15 is a cross sectional view of a terminal of yet another embodiment.

Further, in the aforementioned embodiments, the distance h1 between the upper surface 11 and the lower surface 12 of the terminal 10 in the first areas (pressure receiving areas, non-existing areas) 21 is configured longer than the distance h2 between the upper surface 11 and the lower surface 12 in the second area (no-pressure area, existing area) 22, however, no limitation is made to this configuration. In a yet another embodiment, as shown in FIG. 15, the distance h1 between the upper surface 11 and the lower surface 12 of the terminal 10 in the first areas (pressure receiving areas, non-existing areas) 21 may be equal to the distance h2 between the upper surface 11 and the lower surface 12 in the second area (no-pressure area, existing area) 22. In this case, in the wire connecting method, the upper surface 11 of the terminal 10 is pressed by a pair of upper side jigs 101. One of the upper side jigs 101 in the y direction presses the upper surface 11 of the terminal 10 on a widthwise one end thereof, and the other of the upper side jigs 101 presses the upper surface 11 of the terminal 10 on a widthwise other end thereof. The areas that are pressed by the pair of upper side jigs 101 become the pressure receiving areas 21.

Specific examples of the present teachings have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

Some of the features characteristic to below-described embodiments will herein be listed. It should be noted that the respective technical elements are independent of one another, and are useful solely or in combinations.

A distance between the upper surface and the lower surface in the non-existing area may be longer than a distance between the upper surface and the lower surface in the existing area.

According to this configuration, the non-existing area of the terminal is pressed by the upper side jig and the lower side jig, whereas on the other hand the existing area is not pressed by the aforementioned jigs, so the insulator between the first conductor and the second conductor in the existing area is not pressed in the laminated direction. Due to this, the insulator can be suppressed from being damaged.

What is claimed is:

1. A method of connecting a wire with a terminal including a plurality of conductors, the method comprising:
   positioning the terminal by holding a part of the terminal between an upper side jig and a lower side jig; and
   connecting the wire and one of the plurality of conductors, which is exposed on a surface of the positioned terminal,
   wherein
   the terminal comprises a laminate structure that comprises an insulator interposed between a first conductor and a second conductor,
   the part of the terminal held in the positioning of the terminal comprises a pressure receiving area, where a contact area between the upper side jig and an upper surface of the terminal and a contact area between the lower side jig and a lower surface of the terminal overlap, and
   the laminate structure exists outside of the pressure receiving area, and does not exist in the pressure receiving area.

\* \* \* \* \*